US011088089B2

(12) United States Patent
Oh et al.

(10) Patent No.: US 11,088,089 B2
(45) Date of Patent: Aug. 10, 2021

(54) PACKAGE SUBSTRATE

(71) Applicant: SAMSUNG ELECTRO-MECHANICS CO., LTD., Suwon-si (KR)

(72) Inventors: Yoong Oh, Suwon-si (KR); Sang Hoon Kim, Suwon-si (KR); Young Kuk Ko, Suwon-si (KR); Yong Soon Jang, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 0 days.

(21) Appl. No.: 16/680,998

(22) Filed: Nov. 12, 2019

(65) Prior Publication Data

US 2021/0066210 A1 Mar. 4, 2021

(30) Foreign Application Priority Data

Sep. 2, 2019 (KR) .......................... 10-2019-0108009

(51) Int. Cl.

| | |
|---|---|
| *H01L 23/00* | (2006.01) |
| *H01L 23/31* | (2006.01) |
| *H01L 23/538* | (2006.01) |
| *H01L 23/14* | (2006.01) |
| *H01L 23/498* | (2006.01) |
| *H01L 23/13* | (2006.01) |
| *H01L 23/48* | (2006.01) |
| *H01L 23/522* | (2006.01) |

(Continued)

(52) U.S. Cl.
CPC ........ *H01L 23/562* (2013.01); *H01L 23/3128* (2013.01); *H01L 23/5383* (2013.01); *H01L 23/5386* (2013.01)

(58) Field of Classification Search
CPC ............... H01L 23/562; H01L 23/5383; H01L 23/5386; H01L 23/3128
See application file for complete search history.

(56) References Cited

U.S. PATENT DOCUMENTS

| | | | |
|---|---|---|---|
| 7,626,270 B2 * | 12/2009 | Chen .................. | H01L 21/4857 174/262 |
| 2014/0103527 A1 * | 4/2014 | Marimuthu ......... | H01L 23/3128 257/737 |

FOREIGN PATENT DOCUMENTS

| | | |
|---|---|---|
| JP | 5410660 B2 | 2/2014 |
| KR | 10-2011-0104395 A | 9/2011 |
| KR | 20110104395 A * | 9/2011 |

* cited by examiner

*Primary Examiner* — Marcos D. Pizarro
*Assistant Examiner* — Antonio B Crite
(74) *Attorney, Agent, or Firm* — Morgan, Lewis & Bockius LLP

(57) ABSTRACT

A package substrate includes a wiring substrate comprising an insulating layer, a first wiring layer, and a second wiring layer, wherein the first wiring layer comprises a first pad pattern, and the second wiring layer comprises a second pad pattern; a first passivation layer disposed on the insulating layer, and having a first opening portion passing through a region corresponding to at least a portion of the first pad pattern; a second passivation layer disposed on the insulating layer, and having a second opening portion passing through a region corresponding to at least a portion of the second pad pattern; and a reinforcing layer disposed on the second passivation layer, and having a through portion exposing the second opening portion. An upper surface of the first wiring layer is located in a position higher than a position of the lower surface of the insulating layer.

20 Claims, 13 Drawing Sheets

(51) Int. Cl.
    *H01L 23/485*    (2006.01)
    *H01L 23/525*    (2006.01)
    *H01L 21/56*     (2006.01)

PACKAGE SUBSTRATE

CROSS-REFERENCE TO RELATED APPLICATION(S)

This application claims benefit of priority to Korean Patent Application No. 10-2019-0108009 filed on Sep. 2, 2019 in the Korean Intellectual Property Office, the disclosure of which is incorporated herein by reference in its entirety.

TECHNICAL FIELD

The present disclosure relates to a package substrate on which an electronic component is surface mounted.

BACKGROUND

Recently, a thickness of a package substrate for mounting of a memory in mobile devices has been continuously decreasing. Therefore, while the decrease in a thickness of the package substrate has emerged as a significant technical problem, when the thickness of the package substrate decreases, it may be difficult to drive equipment in the process of the substrate and the assembly process of the package due to problems such as warpage, and the like.

SUMMARY

An aspect of the present disclosure is to provide a package substrate capable of being thinned while overcoming warpage issues.

Another of the present disclosure is to provide a package substrate capable of improving mounting failure of an electrical connection metal, such as solder balls.

According to an aspect of the present disclosure, a coreless wiring substrate is prepared, a passivation layer is disposed on both sides of the wiring substrate, and a reinforcing layer having a through portion is further disposed in a region for mounting an electronic component.

According to an aspect of the present disclosure, a package substrate includes a wiring substrate comprising an insulating layer, a first wiring layer disposed on a lower side of the insulating layer, and a second wiring layer disposed on an upper side of the insulating layer, wherein the first wiring layer comprises a first pad pattern, and the second wiring layer comprises a second pad pattern; a first passivation layer disposed on a lower surface of the insulating layer, and having a first opening portion passing through a region corresponding to at least a portion of the first pad pattern; a second passivation layer disposed on an upper surface of the insulating layer, and having a second opening portion passing through a region corresponding to at least a portion of the second pad pattern; and a reinforcing layer disposed on the second passivation layer, and having a through portion exposing the second opening portion. An upper surface of the first wiring layer is located in a position higher than a position of the lower surface of the insulating layer.

According to an aspect of the present disclosure, a package substrate includes a wiring substrate comprising an insulating layer, a first wiring layer embedded in the insulating layer and exposed from a lower surface of the insulating layer, and a second wiring layer protruding from an upper surface of the insulating layer, wherein the first wiring layer comprises a first pad pattern, and the second wiring layer comprises a second pad pattern; a first passivation layer disposed on the lower surface of the insulating layer, and having a first opening portion passing through a region corresponding to at least a portion of the first pad pattern; a second passivation layer disposed on the upper surface of the insulating layer and having a second opening portion; and a reinforcing layer disposed on the second passivation layer, and having a through portion exposing the second opening portion. The lower surface of the insulating layer and a lower surface of the first wiring layer are coplanar with each other, and the second pad pattern is disposed in the second opening portion and is spaced apart from the second passivation layer.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
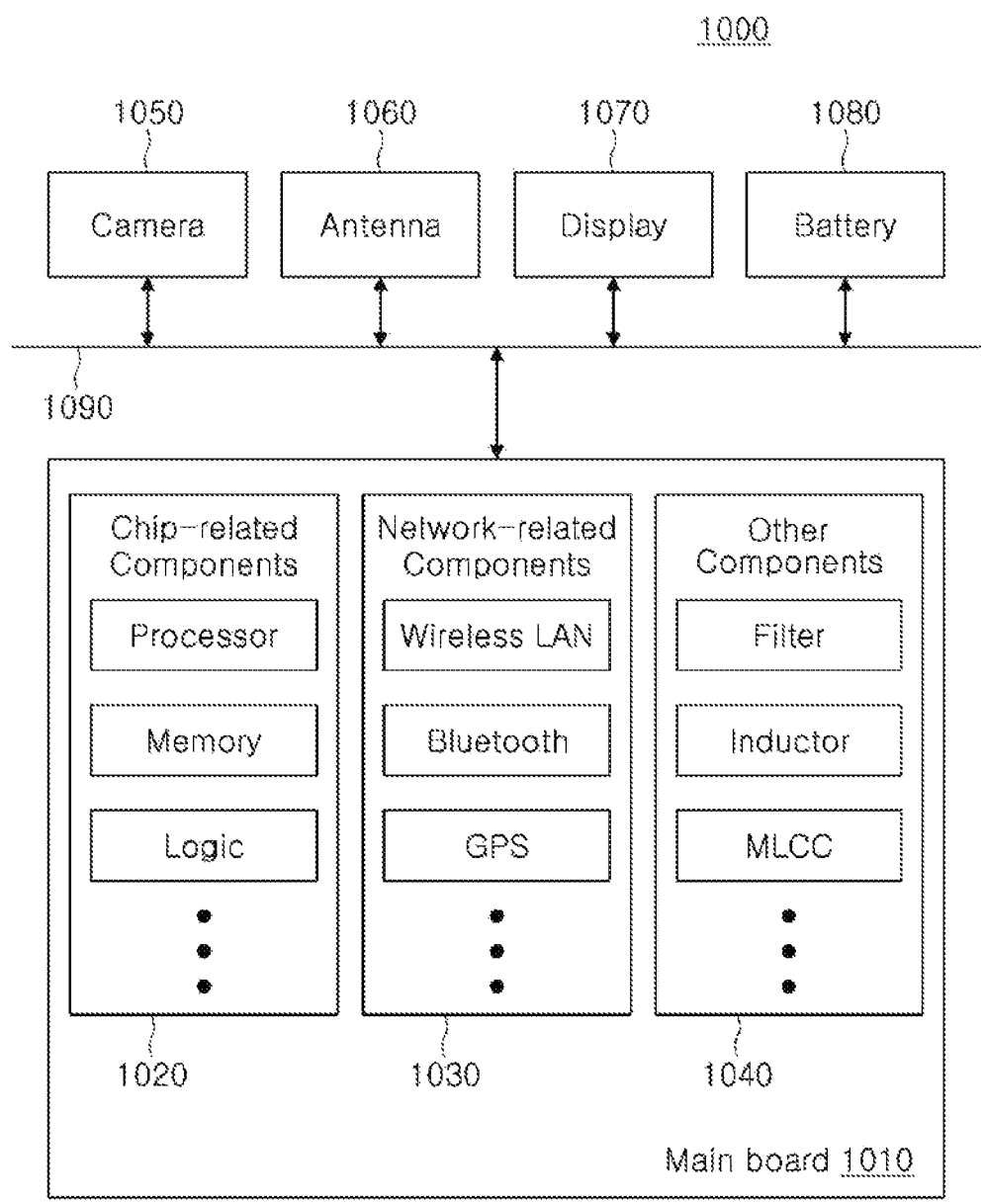
FIG. 1 is a schematic block diagram illustrating an example of an electronic device system.

Hereinafter, the present disclosure will be described with reference to the accompanying drawings. Shapes and sizes of the elements in the drawings may be exaggerated or reduced for more clarity.

Electronics

FIG. 1 is a schematic block diagram illustrating an example of an electronic device system.

Referring to the drawings, an electronic device 1000 may accommodate a main board 1010 therein. The main board 1010 may include chip related components 1020, network related components 1030, other components 1040, and the like, physically and/or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other. The chip related component 1020 may be in the form of a package including the above-described chip or an electronic component.

The network related components 1030 may include protocols such as wireless fidelity (Wi-Fi) (Institute of Electrical and Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 and/or the network related components 1030 described above.

Depending on a type of the electronic device 1000, the electronic device 1000 may include other components that may or may not be physically and/or electrically connected to the main board 1010. These other components may include, for example, a camera module 1050, an antenna module 1060, a display device 1070, a battery 1080, or the like. However, these other components are not limited thereto, but may also include an audio codec, a video codec, a power amplifier, a compass, an accelerometer, a gyroscope, a speaker, amass storage unit (for example, a hard disk drive), a compact disk (CD) drive, a digital versatile disk (DVD) drive, or the like. These other components may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
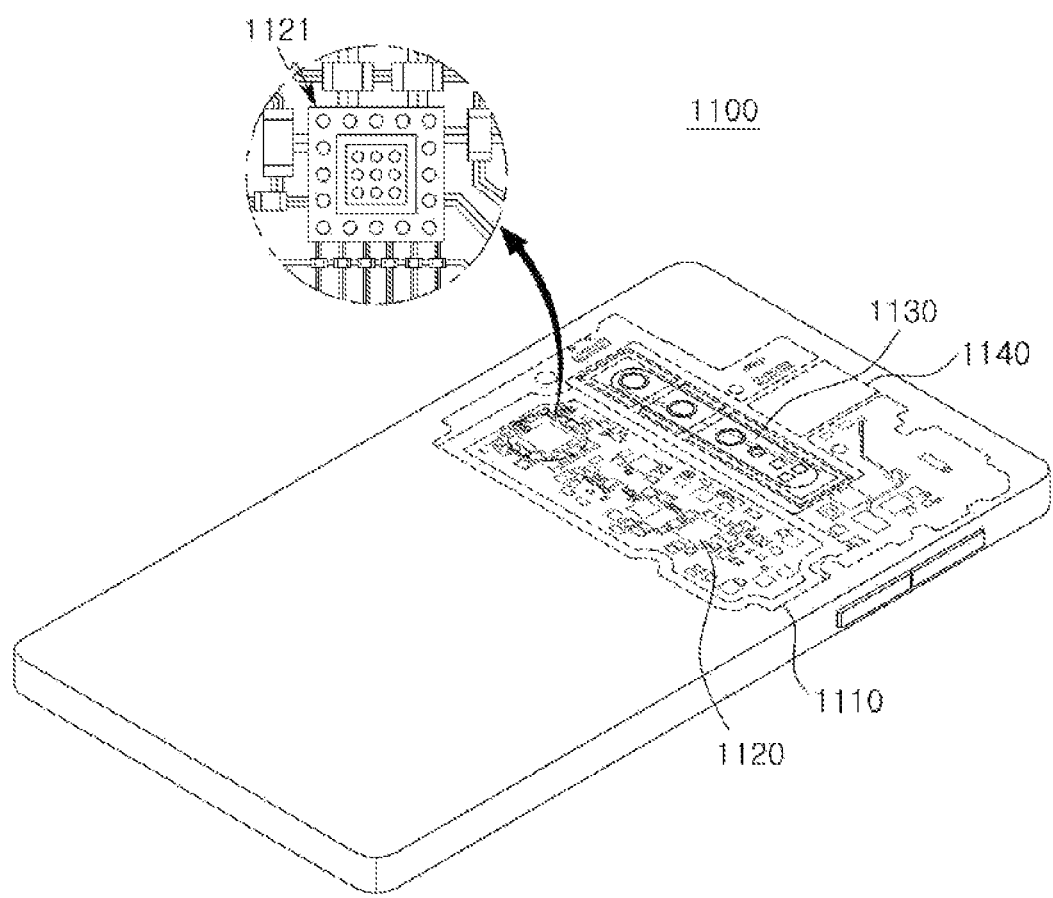
FIG. 2 is a schematic perspective view illustrating an example of an electronic device.

FIG. 2 is a schematic perspective view illustrating an example of an electronic device.

Referring to the drawings, an electronic device may be, for example, a smartphone 1100. The main board 1110 may be accommodated in the smartphone 1100, and various electronic components 1120 may be physically and/or electrically connected to the main board 1110. In addition, other electronic components, such as the camera module 1130 and/or the speaker 1140, which may or may not be physically and/or electrically connected to the main board 1110 may be accommodated therein. A portion of the electronic components 1120 may be the above-described chip related components, for example, a semiconductor package 1121, but are not limited thereto. The semiconductor package 1121 may be a surface in which a semiconductor chip or a passive component is mounted on a package substrate in a package substrate form, but is not limited thereto. The electronic device is not necessarily limited to the smartphone 1100, but may be other electronic devices as described above.

Package Substrate

Figure 3:
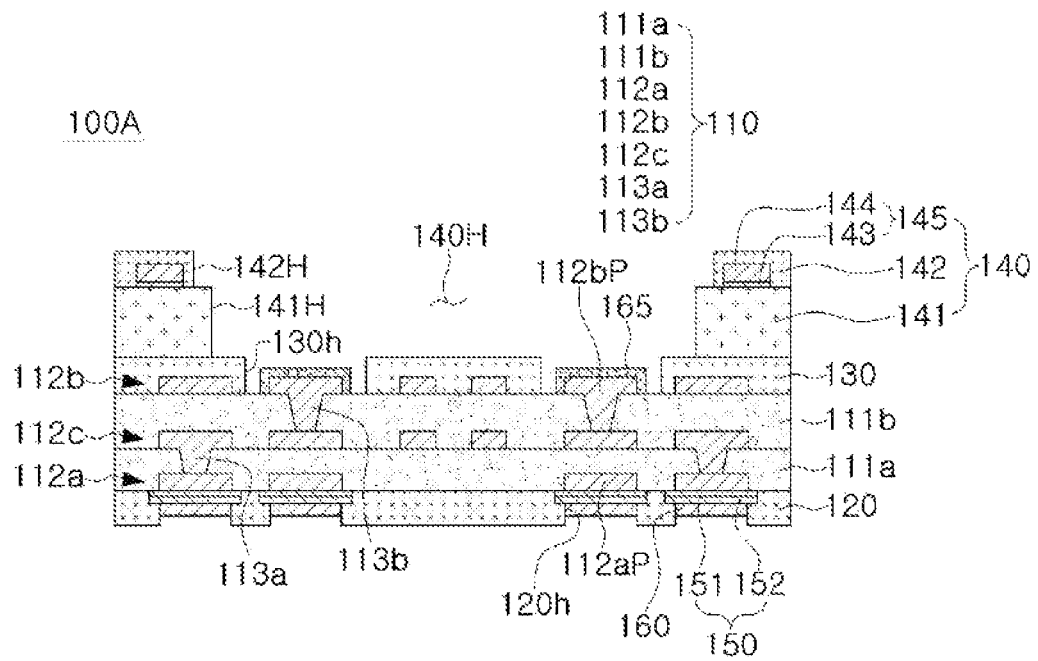
FIG. 3 is a schematic cross-sectional view illustrating an example of a package substrate.

FIG. 3 is a schematic cross-sectional view illustrating an example of a package substrate.

Referring to FIG. 3, a package substrate 100A according to an example may include a wiring substrate 110, a first passivation layer 120 disposed in a position lower than a position of the wiring substrate 110, a second passivation layer 130 disposed in a position higher than a position of the wiring substrate 110, and a reinforcing layer 140 disposed in a position higher than a position of the second passivation layer 130 and having a through portion 140H.

The wiring substrate 110 may include insulating layers 111*a* and 111*b*, a first wiring layer 112*a* disposed in a position lower than a position of the insulating layer 111*b* and between the insulating layer 111*a* and the first passivation layer 120, and a second wiring layer 112*b* disposed in a position higher than positions of the insulating layers 111*a* and 111*b*. The first and second wiring layers 112*a* and 112*b* may include first and second pad patterns 112*a*P and 112*b*P, respectively. The first and second passivation layers 120 and 130 may have first and second opening portions 120*h* and 130*h* respectively passing through regions corresponding to at least a portion of the first and second pad patterns 112*a*P and 112*b*P, respectively. As necessary, a third wiring layer 112*c* may be further disposed in the insulating layers 111*a* and 111*b*, and the third wiring layer 112*c* may be electrically connected to the first and second wiring layers 112*a* and 112*b* through first and second wiring vias 113*a* and 113*b*. An upper surface of the first wiring layer 112*a* may be located in a position higher than a position of a lower surface of the insulating layer 111*a*. For example, the first wiring layer 112*a* may be embedded and disposed in the insulating layer 111*a*. For example, the wiring substrate 110 may be a substrate having a thinned and coreless shape.

As described above, a package substrate 100A according to an example may be a structure that may use the wiring substrate 110, having a thinned and coreless shape, and, thus, may be thinned. Nevertheless, since the first and second passivation layers 120 and 130 may be disposed on both sides of the wiring substrate 110, and the reinforcing layer 140 having the through portion 140H in a region for mounting electronic components on the second passivation layer 130 may be further disposed, only the mounting area of the electronic component may be thinned, remaining portion may increase in thickness, and as a result, bending rigidity may be improved. Therefore, difficulty of driving equipment in the process of the substrate and the assembly process of the package may be overcome. In addition, control for the warpage of the substrate and control for the warpage of the package to which the same is applied may be improved.

The reinforcing layer 140 may include a first reinforcing layer 141 disposed on an upper surface of the second passivation layer 130 and having a first through portion 141H exposing the second opening portion 130h, and a second reinforcing layer 142 disposed on an upper surface of the first reinforcing layer 141 and having a second through portion 142H exposing the first through portion 141H. A width of the second through portion 142H may be wider than a width of the first through portion 141H. For example, the through portion 140H may provide a cavity of a multi-stage type for surface mounting of an electronic component. As such, in the case of a structure having a multilayer of the reinforcing layer 140 and having the cavity of the multi-stage shape, a thickness of the reinforcing layer 140 may increase step by step in the process, and, thus, may be very effective for controlling warpage in the process. In this regard, a thickness of the first reinforcing layer 141 may be thicker than a thickness of the second reinforcing layer 142. For example, the first reinforcing layer 141 may be formed to have a relatively thick thickness, to overcome asymmetry caused by the wiring substrate 110 in the process. However, the present disclosure is not limited thereto.

The reinforcing layer 140 may be a plurality of layers including different kinds of materials. For example, the first and second reinforcing layers 141 and 142 may include different kinds of materials. The second reinforcing layer 142 may include the same kind of material as the first passivation layer 120. The first reinforcing layer 141 may include a material of a kind suitable to maintain rigidity. The second reinforcing layer 142 may be formed at the same time as the first passivation layer 120 in the process, to be used in a symmetrical configuration, and may include a material of a kind suitable for the outermost layer. Therefore, it may be very effective for controlling the warpage in the process.

In this case, the same kind of material refers to that the types of insulating resins to be included are the same as each other, and an inorganic filler and/or a glass fiber of the same kind as each other may be further included as necessary, but does not refer to that the specific contents thereof are the same as each other. In addition, the same kind of material refers to a concept including a case in which there is a difference in some additives, and the like. In this respect, the different kinds of materials refers to that the types of insulating resins to be included are different from each other, the different kinds of materials refers to that an inorganic fillers and/or a glass fibers is included in one of the different kinds of materials, and none of them is included in the other of the different kinds of materials, even when the types of insulating resins to be included are identical to each other, or the different kinds of materials refers to a case in which the kinds of the inorganic fillers and/or the glass fibers are different from each other, but does not refer to that the specific contents thereof are different from each other. In addition, different kinds of materials does not refer to a concept including a case in which there is a difference in some additives, and the like.

The reinforcing layer 140 may further include a metal pattern 145 disposed on the upper surface of the first reinforcing layer 141 and embedded in the second reinforcing layer 142. In this case, it may be more advantageous to secure the rigidity of the thin substrate through the metal pattern 145. The metal pattern 145 may be a dummy pattern electrically insulated from the first to third wiring layers 112a, 112b, and 112c of the wiring substrate 110, but is not limited thereto.

The first pad pattern 112aP may be embedded and disposed in a position lower than a position of the insulating layer 111b, to expose a lower surface of first pad pattern 112aP the from the lower surface of the insulating layer 111a. As described above, since the first pad pattern 112aP may be embedded in a lower position of the insulating layer 111a, a thickness of the first passivation layer 120 may be sufficiently secured. Therefore, the mounting failure of the electrical connection metal such as solder balls may be lowered.

A metal layer 150 may be disposed on the lower surface of the first pad pattern 112aP, and at least a portion of the metal layer 150 may extend on the lower surface of the insulating layer 111a. A portion of a lower surface of the metal layer 150 may be covered by the first passivation layer 120, and the other portion of the lower surface of the metal layer 150 may be exposed from the first passivation layer 120 by the first opening portion 120h. For example, a width of the metal layer 150 may be wider than a width of the first pad pattern 112aP. As such, when the metal layer 150 is disposed, the rigidity of the substrate may be improved, and it may be more effective in controlling the warpage in the process of the thin substrate having the asymmetric shape. In addition, since the connection reliability may be improved through the metal layer 150, mountability of the substrate may be improved.

A first surface treatment layer 160 may be disposed on the other portion of the lower surface of the metal layer 150 exposed from the first passivation layer 120 by the first opening portion 120h. The first surface treatment layer 160 may be formed by an electrolytic gold plating process, an electroless gold plating process, an organic solderability preservative (OSP) plating process, an electroless tin plating process, an electroless silver plating process, an electroless nickel and immersion gold (ENIG) plating process, a direct immersion gold (DIG) plating process, a hot air solder leveling (HASL) process, or the like. The connection reliability of the electrical connection metal such as solder ball may be further improved through the first surface treatment layer 160. Therefore, the mountability of the substrate may be further improved.

The second wiring layer 112b may protrude from and disposed on the upper surface of the insulating layer 111b. At least a portion of the second wiring layer 112b may be embedded in the reinforcing layer 140. The second pad pattern 112bP may be disposed in the second opening portion 130h. The second opening portion 130h may expose the second pad pattern 112bP from the second passivation layer 130 in a non-solder mask defined (NSMD) shape, for example. For example, the second opening portion 130h may expose at least a portion of upper and side surfaces of the second pad pattern 112bP from the second passivation layer 130. In this case, the second opening portion 130h may expose at least a portion of the upper surface of the insulating layer 111b. In this case, the electronic component may be stably mounted in a through portion 140H of the reinforcing layer 140 to be effectively connected to the second pad pattern 112bP.

A second surface treatment layer 165 may be disposed on at least a portion of the upper and side surfaces of the second pad pattern 112bP exposed from the second passivation layer 130 by the second opening portion 130h. For example, the second surface treatment layer 165 may be disposed in the second opening portion 130h to cover at least a portion of the upper and side surfaces of the second pad pattern 112bP. The second surface treatment layer 165 may also be formed by an electrolytic gold plating process, an electroless gold plating process, an organic solderability preservative (OSP) plating process, an electroless tin plating process, an electroless silver plating process, an electroless nickel and immersion gold (ENIG) plating process, a direct immersion gold (DIG) plating process, a hot air solder leveling (HASL) process, or the like. In this case, since the electronic component may be more stably mounted in the through portion 140H of the reinforcing layer 140, it may be more effectively connected to the second pad pattern 112bP.

Hereinafter, components of a package substrate 100A according to an example will be described in more detail with reference to the drawings.

A wiring substrate 110 may include insulating layers 111a and 111b, a first wiring layer 112a disposed in a position lower than a position of the insulating layer 111b, and a second wiring layer 112b disposed in a position higher than positions of the insulating layers 111a and 111b. The first and second wiring layers 112a and 112b may include first and second pad patterns 112aP and 112bP, respectively. As necessary, a third wiring layer 112c may be further disposed in the insulating layers 111a and 111b, and the third wiring layer 112c may be electrically connected to the first and second wiring layers 112a and 112b through first and second wiring vias 113a and 113b, respectively. An upper surface of the first wiring layer 112a may be located in a position higher than positions of a lower surface of the insulating layer 111a. For example, the first wiring layer 112a may be embedded and disposed in a position lower than positions of the insulating layers 111a and 111b. For example, the wiring substrate 110 may be a substrate having a thinned and coreless shape.

An insulating material may be used as a material of the first and second insulating layers 111a and 111b. In this case, as the insulating material, a thermosetting resin such as an epoxy resin, a thermoplastic resin such as polyimide, or materials including reinforcements such as glass fiber, glass cloth, glass fabric and/or inorganic fillers, together with these, such as prepreg, Ajinomoto Build-up Film (ABF), and the like may be used. The first and second insulating layers 111a and 111b may include the same kinds of materials as each other, and in this case, a boundary between the first and second insulating layers 111a and 111b may be unclear, depending on the process. For example, the first and second insulating layers 111a and 111b may be treated as a single insulating layer. The present disclosure is not limited thereto, and a boundary between the first and second insulating layers 111a and 111b may be present in the case of including the same kinds of materials as well as in the case of including different kinds of materials. For example, the first and second insulating layers 111a and 111b may be treated as a plurality of insulating layers. The first insulating layer 111a may not include glass fiber, and the second insulating layer 111b may include glass fiber. In this case, the second insulating layer 111b may be thicker than the first insulating layer 111a, but is not limited thereto.

A metal material may be used as the material of the first to third wiring layers 112a, 112b, and 112c. In this case, as the metal material, copper (Cu), aluminum (Al), silver (Ag), tin (Sn), gold (Au), nickel (Ni), lead (Pb), titanium (Ti), alloys thereof, or the like may be used. The first to third wiring layers 112a, 112b, and 112c may be formed by plating processes such as an additive process (AP), a semi additive process (SAP), a modified semi additive process (MSAP), a tenting (TT) process, or the like, respectively. As a result, a seed layer, which may be an electroless plating layer, and an electrolytic plating layer formed based on the seed layer may be included. Each of the first to third wiring layers 112a, 112b, and 112c may perform various functions, depending on a design of a layer of interest. For example, a ground (GND) pattern, a power (PWR) pattern, a signal (S) pattern, and the like may be included. In this case, the signal (S) pattern may include various signals except for the ground (GND) pattern, the power (PWR) pattern, and the like, for example, a data signal, and the like. As necessary, the ground (GND) pattern and the power (PWR) pattern may be the same pattern as each other. These patterns may each include a line pattern, a plane pattern, and/or a pad pattern.

A metal material may also be used as the material of the first and second wiring vias 113a and 113b. In this case, as the metal material, copper (Cu), aluminum (Al), silver (Ag), tin (Sn), gold (Au), nickel (Ni), lead (Pb), titanium (Ti), alloys thereof, or the like may be used. The first and second wiring vias 113a and 113b may also be formed by plating processes such as AP, SAP, MSAP, a TT process, or the like, respectively. As a result, a seed layer, which may be an electroless plating layer, and an electrolytic plating layer formed based on the seed layer may be included. Each of the first and second wiring vias 113a and 113b may be completely filled with a metal material, or the metal material may be formed along a wall of a hole of the via. In addition, they may have a tapered shape in the same direction as each other. The first and second wiring vias 113a and 113b may also perform various functions, depending on a design of a layer of interest, respectively. For example, the first and second wiring vias 113a and 113b may include a wiring via for signal connection, a wiring via for ground connection, a wiring via for power connection, or the like, respectively. As necessary, the wiring via for ground connection may also be identical to the wiring via for power connection.

The first and second passivation layers 120 and 130 may protect an internal structure of the wiring substrate 110 from physical or chemical damage, or the like externally. The first and second passivation layers 120 and 130 may include a thermosetting resin. For example, the first and second passivation layers 120 and 130 may be ABFs. The present disclosure is not limited thereto, and the first and second passivation layers 120 and 130 may be well-known solder resist (SR) layers, respectively. In addition, as necessary, the first and second passivation layers 120 and 130 may include a photo imageable dielectric (PID). The first passivation layer 120 may have a first opening portion 120h passing through a region corresponding to the first pad pattern 112aP. The second passivation layer 130 may have a second opening portion 130h passing through a region corresponding to the second pad pattern 112bP. The first and second opening portions 120h and 130h may be provided in plural, respectively. For example, the number of the first and second opening portions 120h and 130h may vary, depending on the number of the first and second pad patterns 112aP and 112bP.

First and second reinforcing layers 141 and 142 may impart rigidity to the substrate. In addition, a region for mounting an electronic component may be provided. The first and second reinforcing layers 141 and 142 may have first and second through portions 141H and 142H, respectively. A width of the second through portion 142H may be wider than a width of the first through portion 141H. For example, the through portion 140H of the reinforcing layer 140 may provide a cavity having a multi-stage shape for surface mounting of an electronic component. The first and second reinforcing layers 141 and 142 may include an insulating material. In this case, the first and second reinforcing layers 141 and 142 may include different kinds of materials. For example, a prepreg may be used as a material of the first reinforcing layer 141. In addition, as a material of the second reinforcing layer 142, ABF, SR, PID, or the like may be used. The present disclosure is not limited thereto.

A metal pattern 145 may include a metal material such as copper (Cu), aluminum (Al), silver (Ag), tin (Sn), gold (Au), nickel (Ni), lead (Pb), titanium (Ti), alloys thereof, or the like. The metal pattern 145 may be formed by a plating process such as AP, SAP, MSAP, TT, or the like. As a result, a seed layer 143, which may be an electroless plating layer, and an electrolytic plating layer 144 formed based on the seed layer and having a relatively thicker thickness may be included. The metal pattern 145 may be a dummy pattern electrically insulated from the first to third wiring layers 112*a*, 112*b*, and 112*c* of the wiring substrate 110, but is not limited thereto.

A metal layer 150 also may include a metal material such as copper (Cu), aluminum (Al), silver (Ag), tin (Sn), gold (Au), nickel (Ni), lead (Pb), titanium (Ti), alloys thereof, or the like. The metal layer 150 may be similarly formed by a plating process such as AP, SAP, MSAP, TT, or the like. As a result, a seed layer 151, which may be copper foil, and an electrolytic plating layer 152 formed based on the seed layer and having a relatively thicker thickness. The metal layer 150 may be formed wider than the first pad pattern 112*a*P, such that at least a portion of the metal layer 150 may be embedded in the first passivation layer 120.

The first and second surface treatment layers 160 and 165 may include a metal material such as a noble metal. For example, the first and second surface treatment layers 160 and 165 may be formed by an electrolytic gold plating process, an electroless gold plating process, an OSP plating process, an electroless tin plating process, an electroless silver plating process, an electroless nickel and immersion gold (ENIG) plating process, a DIG plating process, a HASL process, or the like.

Figure 4:
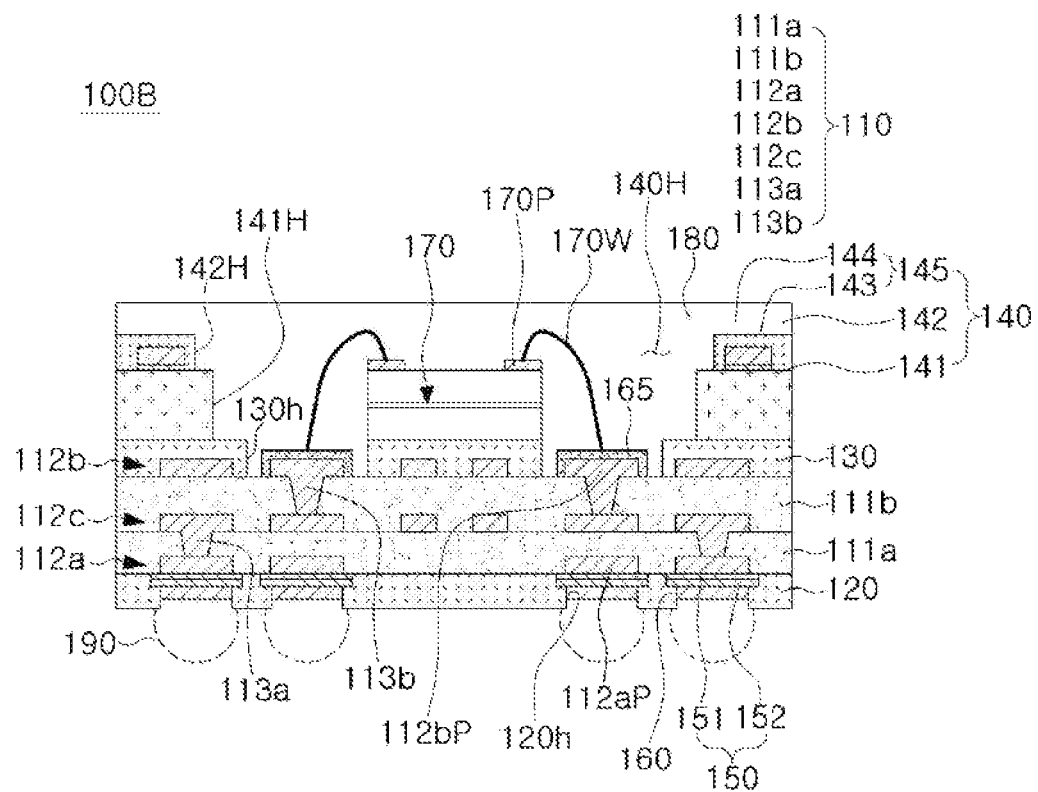
FIG. 4 is a schematic cross-sectional view illustrating a modified example of the package substrate of FIG. 3.

FIG. 4 is a schematic cross-sectional view illustrating a modified example of the package substrate of FIG. 3.

Referring to the drawings, a package substrate 100B according to a modified example may further include an electronic component 170 disposed on the second passivation layer 130 and electrically connected to the second pad pattern 112*b*P, in the through portion 140H of the reinforcing layer 140. As necessary, the package substrate 100B may further include a molding material 180 disposed on the second passivation layer 130, filling at least a portion of the through portion 140H, and covering at least a portion of the electronic component 170. In addition, the package substrate 100B may further include an electrical connection metal 190 disposed on the first passivation layer 120 and electrically connected to the first pad pattern 112*a*P. Since other configurations are the same as those in the package substrate 100A according to the above-described example, only added configurations will be described below.

The electronic component 170 may be a known active component or passive component. The active component may include various types of integrated circuit dies. For example, the electronic component 170 may be a memory die such as a volatile memory (DRAM), a non-volatile memory (ROM), or a flash memory, or may be a stack memory die, but is not limited thereto. Examples of the passive component may include a chip type inductor, a chip type capacitor, a chip type bead, or the like. The electronic component 170 may have a connection electrode 170P, and the connection electrode 170P may be electrically connected by bonding the second pad pattern 112*b*P and a metal wire 170W. The connection electrode 170P may be connected to the second surface treatment layer 165 by the bonding of the metal wire 170W. The connection electrode 170P may include a metal material such as copper (Cu), aluminum (Al), or the like. The metal wire 170W may also include a metal material such as copper (Cu), gold (Au), or the like.

The molding material 180 may protect the electronic component 170, and may fix the electronic component 170. An insulating material may be used as a material of the molding material 180. In this case, the insulating material may be a thermosetting resin such as an epoxy resin, a thermoplastic resin such as polyimide, or materials including reinforcements such as glass fiber, glass cloth, glass fabric and/or inorganic fillers, together with these, such as prepreg, ABF, and the like. As necessary, an epoxy molding compound (EMC) may be used.

The electrical connection metal 190 may be configured to surface mount the package substrate 100B on a main board or other printed circuit board. The electrical connection metal 190 may be made of a low melting point metal having a lower melting point than copper (Cu), for example, tin (Sn) or an alloy containing tin (Sn). For example, the electrical connection metal 190 may be formed of a solder or the like, but is merely an example, and the material thereof is not particularly limited thereto. The electrical connection metal 190 may be a land, a ball, a pin, or the like. The electrical connection metal 190 may be formed of multiple layers or a single layer. In a case of being formed in multiple layers, the electrical connection metal 190 may include a copper pillar and solder. In a case of being formed in a single layer, the electrical connection metal 190 may include a tin-silver solder, but is merely an example, and is not limited thereto. The number, interval, arrangement, etc. of the electrical connection metal 190 are not particularly limited, and may be sufficiently modified, depending on a design specification.

FIGS. 5 to 8 are schematic process diagrams illustrating an example of manufacturing the package substrate of FIG. 3.

Figure 5:
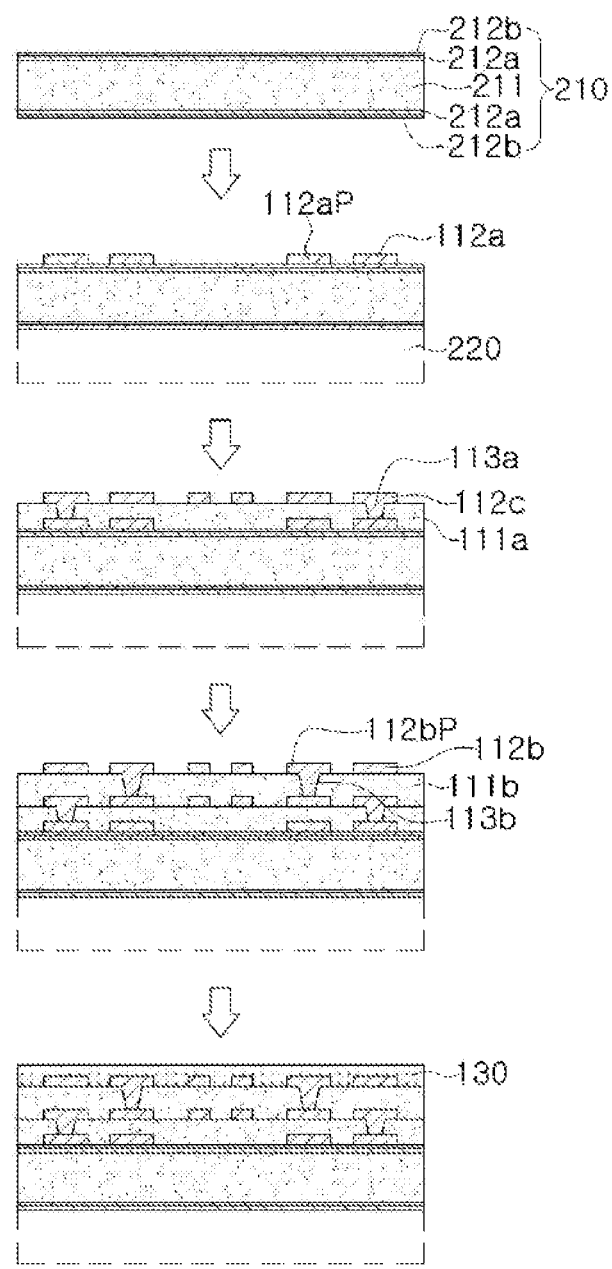
FIGS. 5 to 8 are schematic process diagrams illustrating an example of manufacturing the package substrate of FIG. 3.

Referring first to FIG. 5, a detach carrier film 210 including a core layer 211 and a plurality of metal foils 212*a* and 212*b* respectively arranged on both surfaces of the core layer 211 may be prepared. Next, the metal foil 212*b* may be used as a seed layer to form a first wiring layer 112*a* by a plating operation. In this case, a structure 220 corresponding to those described above may be formed in a position lower than a position of the detach carrier film 210, and may be also applied in the same manner to those described above. Next, a first insulating layer 111*a* may be formed, and a third wiring layer 112*c* and a first wiring via 113*a* may be formed by a plating operation. Next, a second insulating layer 111*b* may be formed, and a second wiring layer 112*b* and a second wiring via 113*b* may be formed by a plating operation. Next, a second passivation layer 130 may be formed. Since the first insulating layer 111*a* and the first wiring layer 112*a* are both formed on a surface of the metal foil 212*b*, lower surfaces of the first insulating layer 111*a* and the first wiring layer 112*a* may be coplanar with, or substantially coplanar with, each other.

Figure 6:
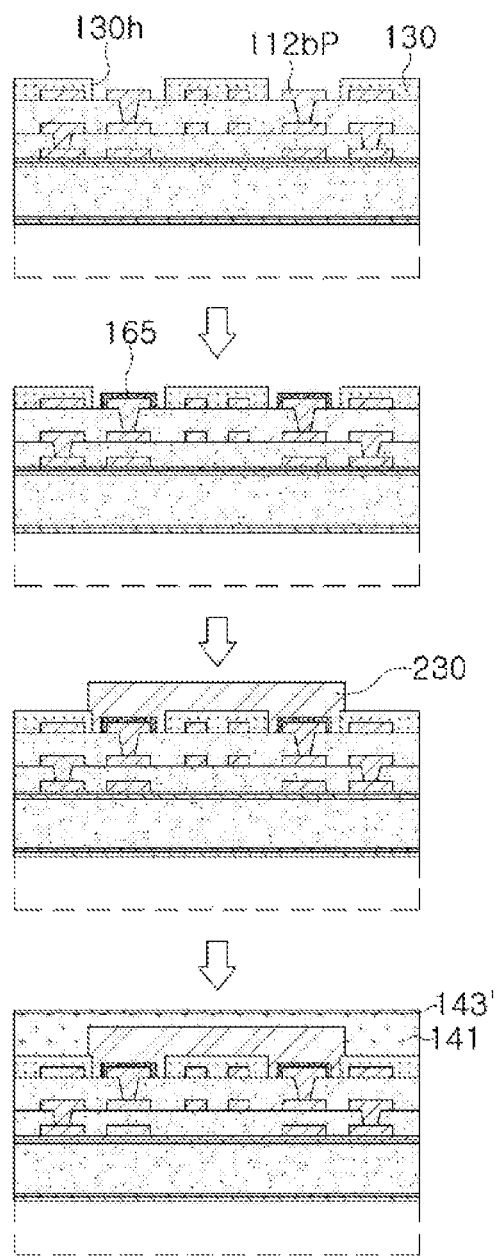

Referring to FIG. 6, next, a second opening portion 130*h* exposing a second pad pattern 112*b*P from the second passivation layer 130 may be formed. Next, a second surface treatment layer 165 may be formed on the second pad pattern 112*b*P. Thereafter, the second pad pattern 112*b*P and the second surface treatment layer 165 may be covered by a dry film 230. Next, a first reinforcing layer 141 may be formed. A metal foil 143' may be stacked on an upper surface of the first reinforcing layer 141.

Figure 7:
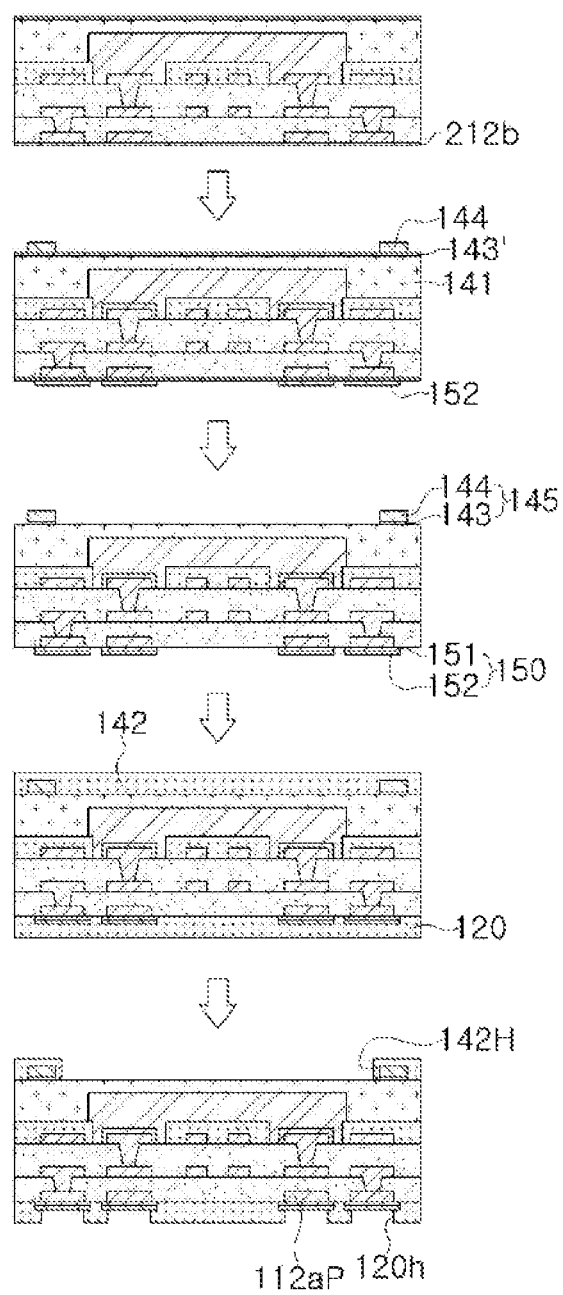

Referring to FIG. 7, next, a separation operation may be performed from the detach carrier film 210. In this case, the metal foil 212b may remain. Next, the metal foils 143' and 212b may be used as seed layers to form plating layers 144 and 152 by a plating operation, respectively. Thereafter, a metal pattern 145 including a seed layer 143 and the plating layer 144, and a metal layer 150 including a seed layer 151 and the plating layer 152 may be formed by a seed etching operation. Next, both sides thereof may be covered with a second reinforcing layer 142 and a first passivation layer 120, respectively. In this manner, warpage balance in the process may be controlled. Thereafter, a second through portion 142H and a first opening portion 120h may be formed in the second reinforcing layer 142 and the first passivation layer 120, respectively. The first opening portion 120h may be formed to pass through the first passivation layer 120, in a region corresponding to the first pad pattern 112aP, to expose the metal layer 150.

Figure 8:
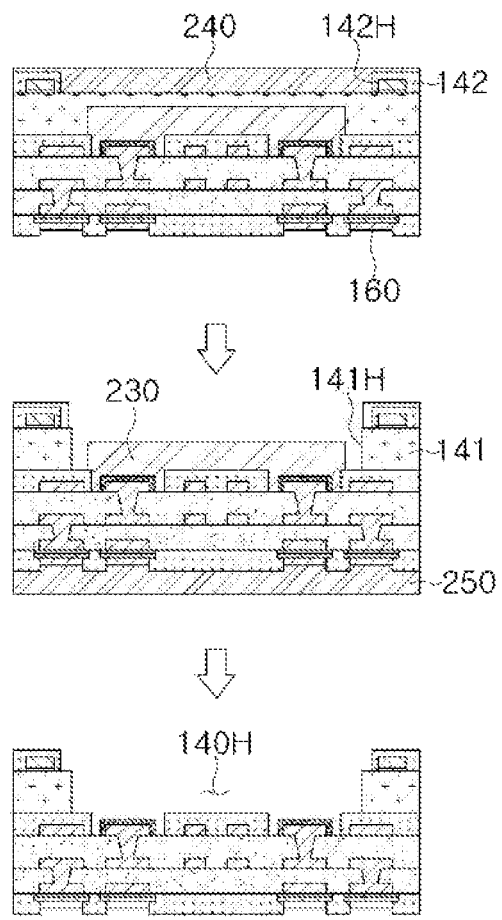

Referring to FIG. 8, next, a dry film 240 may cover the second reinforcing layer 142 and may fill the second through portion 142H. Thereafter, a first surface treatment layer 160 may be formed by a plating operation. Next, in a state in which a lower side thereof is blocked by a dry film 250, the dry film 240 may be removed, and a first through portion 141H passing through the first reinforcing layer 141 may be formed. Thereafter, the dry films 230 and 250 may be removed, and a through portion 140H may be implemented. The package substrate 100A according to the example described above may be manufactured through the series of operations.

Figure 9:
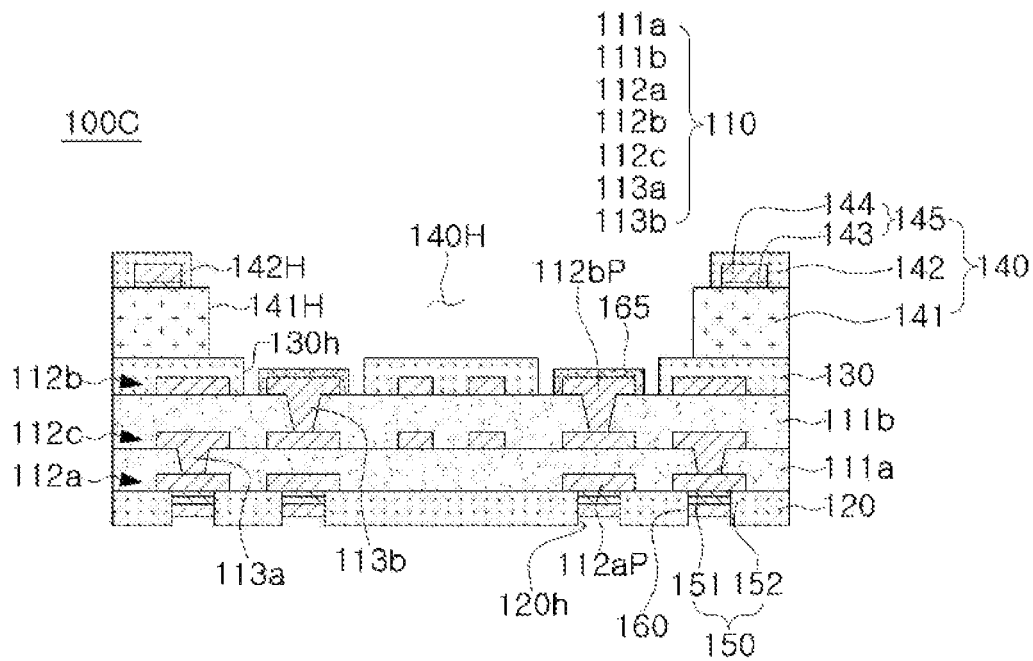
FIG. 9 is a schematic cross-sectional view illustrating another example of a package substrate.

FIG. 9 is a schematic cross-sectional view illustrating another example of a package substrate.

Figure 10:
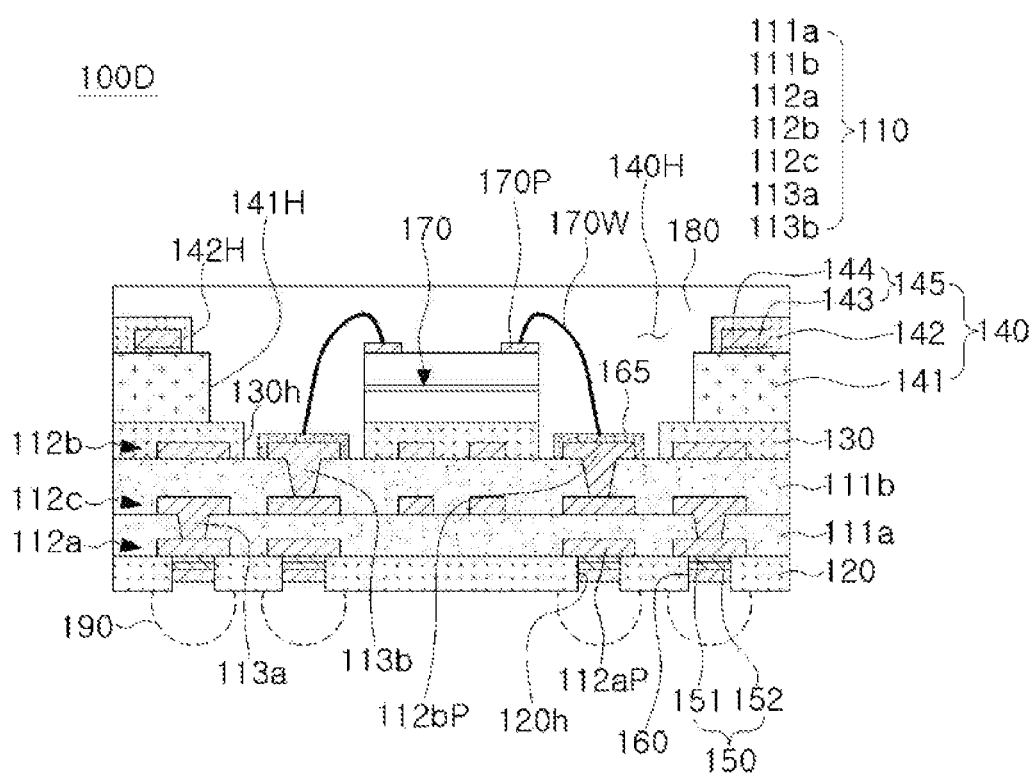
FIG. 10 is a schematic cross-sectional view of a modified example of the package substrate of FIG. 9.

FIG. 10 is a schematic cross-sectional view of a modified example of the package substrate of FIG. 9.

Referring to the drawings, a package substrate 100C according to another example and a package substrate 100D according to a modified example thereof may include a metal layer 150 having a different arrangement, compared to the package substrate 100A according to the example and the package substrate 100B according to the modified example thereof. In another example, the metal layer 150 may be disposed on the lower surface of the first pad pattern 112aP in the first opening portion 120h, exposed from the first passivation layer 120 by the first opening portion 120h. Therefore, a width of the metal layer 150 may be narrower than a width of the first pad pattern 112aP. The first surface treatment layer 160 may be disposed on a lower surface of the metal layer 150 in the first opening portion 120h. Since the others may be substantially the same as described above, detailed description thereof will be omitted.

Figure 11:
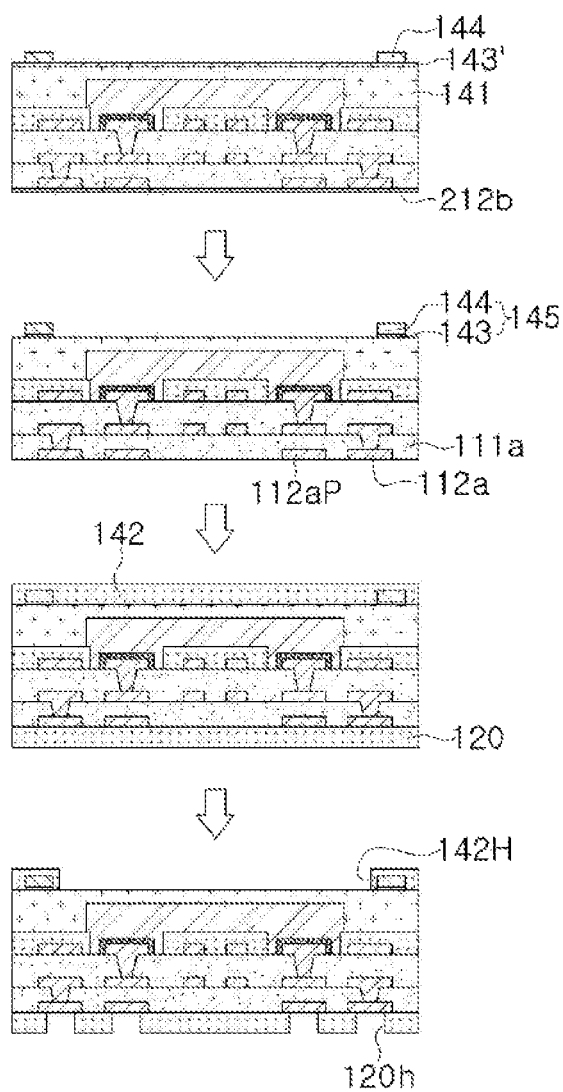
FIGS. 11 and 12 are schematic process diagrams illustrating an example of manufacturing the package substrate of FIG. 9.
Figure 12:
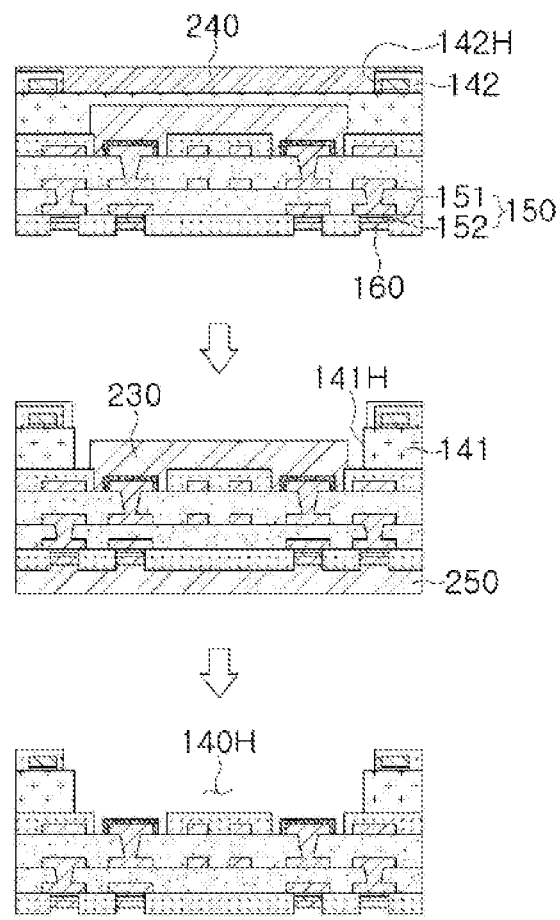

FIGS. 11 and 12 are schematic process diagrams illustrating an example of manufacturing the package substrate of FIG. 9.

Referring to FIG. 11, after the processes of FIGS. 5 and 6 described above, the metal foil 143' disposed on the first reinforcing layer 141 may be used as a seed layer to form a plating layer 144 by a plating operation, before a peeling operation. The peeling operation may be then performed from the detach carrier film. Next, a metal pattern 145 including a seed layer 143 and the plating layer 144 may be formed by a seed etching operation. In this case, the metal foil 212b may be removed by an etching operation, and in some cases, the lower surface of the first wiring layer 112a may be also partially removed by an etching operation, to have a step difference between the lower surface of the first wiring layer 112a and the lower surface of the first insulating layer 111a. Thereafter, a second reinforcing layer 142 and a first passivation layer 120 may be formed. In this manner, warpage balance in the process may be controlled. Next, a second through portion 142H and a first opening portion 120h may be formed in the second reinforcing layer 142 and the first passivation layer 120, respectively.

Referring to FIG. 12, next, a dry film 240 may cover the second reinforcing layer 142 and may fill the second through portion 142H. Thereafter, a metal layer 150 including a seed layer 151 and a plating layer 152 may be formed by a plating operation, and a first surface treatment layer 160 may be formed on the metal layer 150. Next, in a state in which a lower side thereof is blocked by a dry film 250, the dry film 240 may be removed, and a first through portion 141H passing through the first reinforcing layer 141 may be formed. Thereafter, the dry films 230 and 250 may be removed, and a through portion 140H may be implemented. The package substrate 100C according to the example described above may be manufactured through the series of operations.

Figure 13:
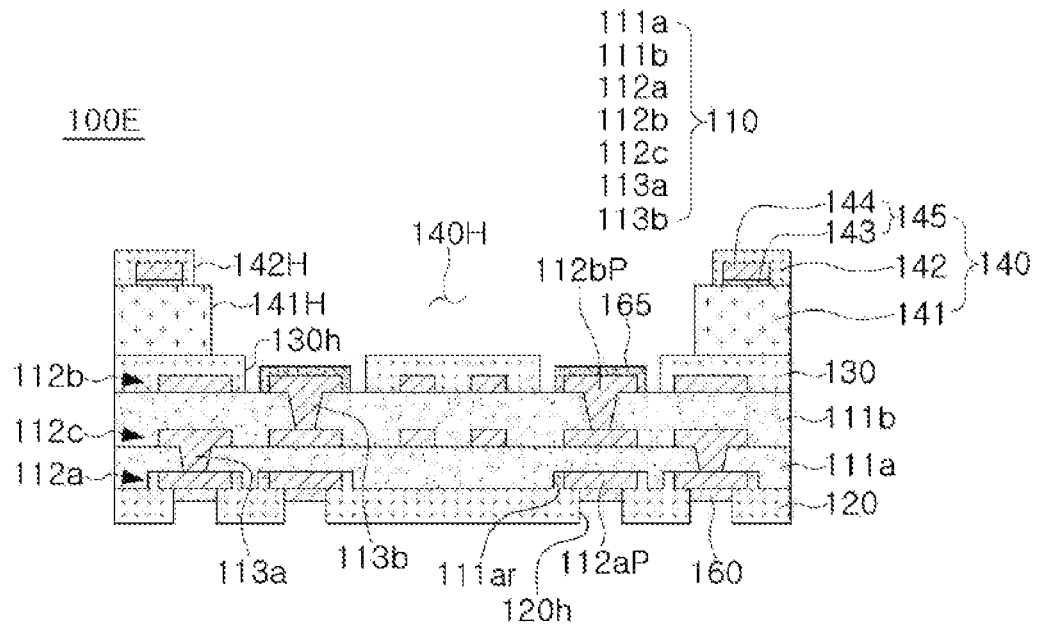
FIG. 13 is a schematic cross-sectional view illustrating another example of a package substrate.

FIG. 13 is a schematic cross-sectional view illustrating another example of a package substrate.

Figure 14:
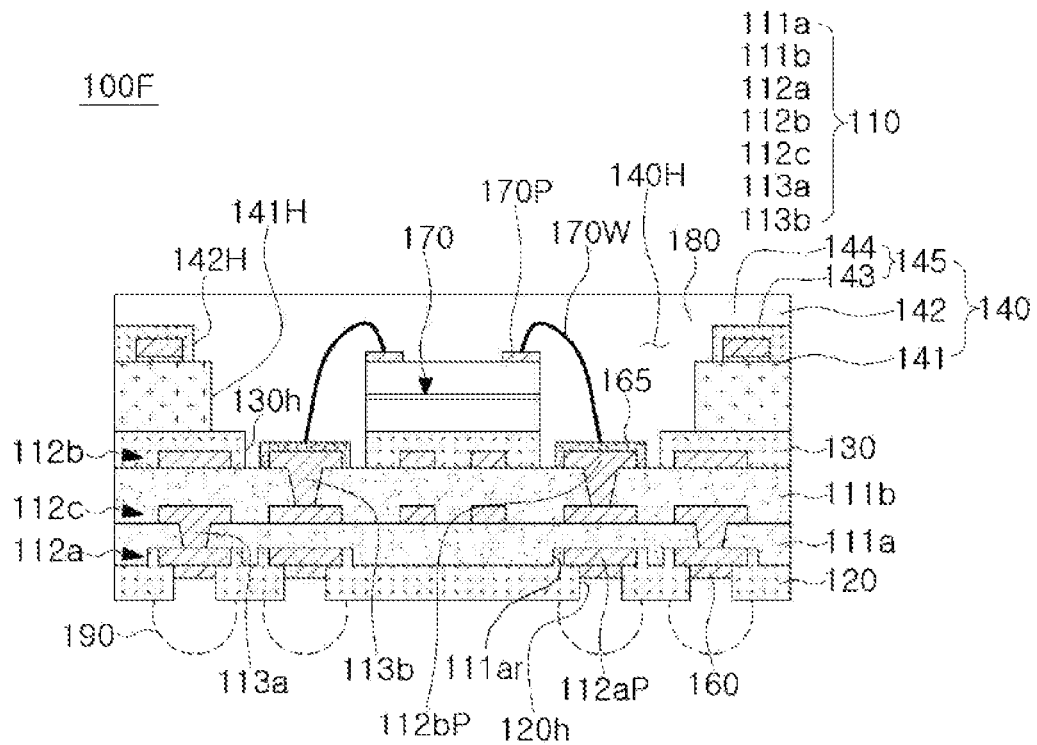
FIG. 14 is a schematic cross-sectional view of a modified example of the package substrate of FIG. 13.

FIG. 14 is a schematic cross-sectional view of a modified example of the package substrate of FIG. 13.

Referring to the drawings, a package substrate 100E according to another example and a package substrate 100F according to a modified example thereof may include a first wiring layer 112a having a different arrangement, compared to the package substrate 100A according to an example and the package substrate 100B according to the modified example thereof. In another example, the first insulating layer 111a may have a recess portion 111ar in a position lower than a position of the first insulating layer 111a, and at least a portion of the first wiring layer 112a may be disposed in the recess portion 111ar. For example, a first pad pattern 112aP may be disposed in the recess portion 111ar, and at least a portion of lower and side surfaces of the first pad pattern 112aP may be exposed from the first insulating layer 111a by the recess portion 111ar. By the above, a thickness of the first passivation layer 120 may be sufficiently secured. Therefore, the mounting failure of the electrical connection metal such as solder balls may be lowered. The first passivation layer 120 may fill at least a portion of the recess portion 111ar, and may cover at least a portion of the lower surface and at least a portion of the side surface of the first pad pattern 112aP. Therefore, the bonding reliability may be improved by increasing a bonding area between the first insulating layer 111a and the first passivation layer 120 and between the first pad pattern 112aP and the first passivation layer 120. A first surface treatment layer 160 may be formed on at least another portion of the lower surface of the first pad pattern 112aP in a first opening portion 120h, exposed from the first passivation layer 120 by the first opening portion 120h. For example, the metal layer 150 may be omitted. Since the others may be substantially the same as described above, detailed description thereof will be omitted.

Figure 15:
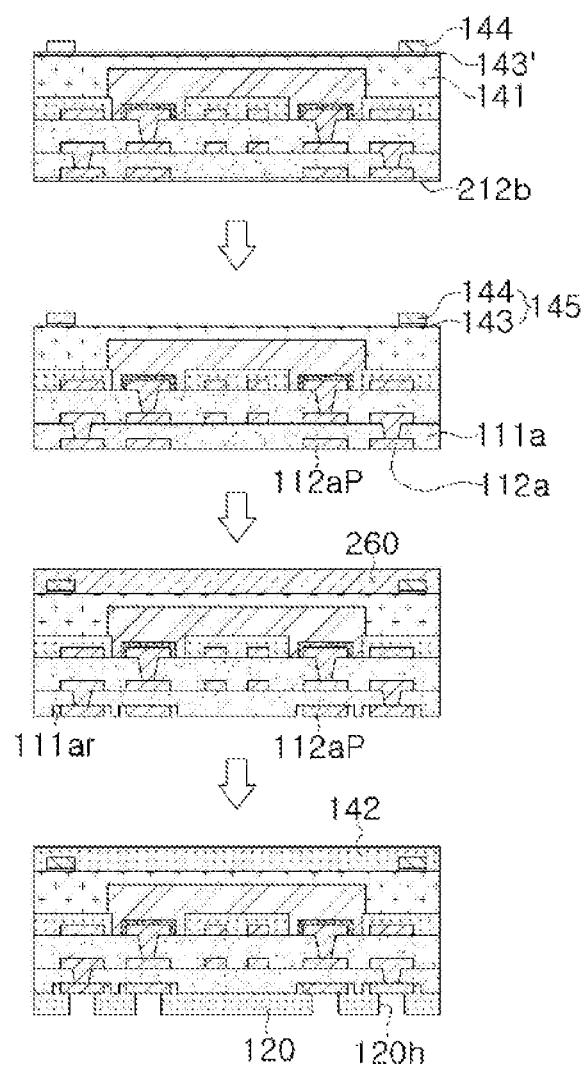
FIGS. 15 and 16 are schematic process diagrams illustrating an example of manufacturing the package substrate of FIG. 13.
Figure 16:
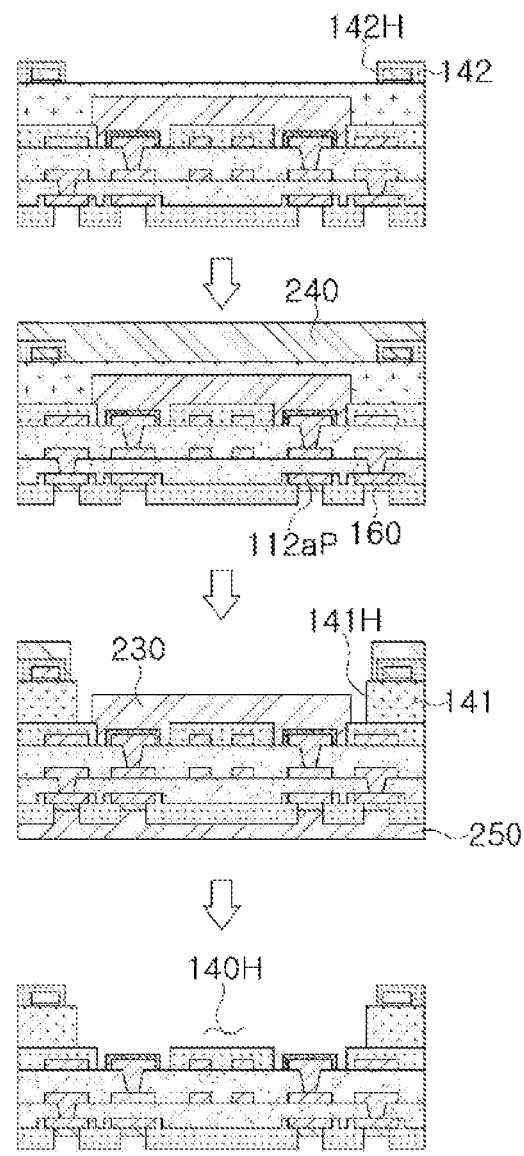

FIGS. 15 and 16 are schematic process diagrams illustrating an example of manufacturing the package substrate of FIG. 13.

Referring to FIG. 15, after the processes of FIGS. 5 and 6 described above, the metal foil 143' disposed on the first reinforcing layer 141 may be used as a seed layer to form a plating layer 144 by a plating operation, before a peeling operation. The peeling operation may be then performed from the detach carrier film. Next, a metal pattern 145 including a seed layer 143 and the plating layer 144 may be formed by a seed etching operation. In this case, the metal foil 212b may be removed by an etching operation, and in some cases, a lower surface of the first wiring layer 112a and a first pad pattern 112aP included in the first wiring layer 112a may also be partially removed by an etching operation, to have a step difference between the lower surface of the first wiring layer 112a and the first pad pattern 112aP included in the first wiring layer 112a and a lower surface of the first insulating layer 111a. Thereafter, a dry film 260 may be formed on the first reinforcing layer 141 to cover a metal pattern 145. Next, a recess portion 111ar exposing at least a portion of the lower and side surfaces of the first pad pattern 112aP from the first insulating layer 111a may be formed on the first insulating layer 111a by a resin etching operation. Thereafter, the dry film 260 may be removed, and a second reinforcing layer 142 and a first passivation layer 120 may be formed. In this manner, warpage balance in the process may be controlled. Next, a first opening portion 120h may be formed in the first passivation layer 120.

Referring to FIG. 16, a second through portion 142H may be formed in the second reinforcing layer 142. Next, a dry film 240 may cover the second reinforcing layer 142 and may fill the second through portion 142H. Thereafter, a first surface treatment layer 160 may be formed by a plating operation. Next, in a state in which a lower side thereof is blocked by a dry film 250, the dry film 240 may be removed, and a first through portion 141H passing through the first reinforcing layer 141 may be formed. Thereafter, the dry films 230 and 250 may be removed, and a through portion 140H may be implemented. The package substrate 100E according to the example described above may be manufactured through the series of operations.

In the present specification, the words "in a position lower than a position of", "lower portion", "lower surface", and the like are used to refer to the downward direction with respect to the cross section of the drawing for convenience, while the words "in a position higher than a position of", "upper portion", "upper surface", and the like are used to refer to a direction opposite thereto. It should be understood that, the definitions refer to directions for convenience of explanation, the scope of the claims is not particularly limited by the description of such directions, and the concepts of the upward/downward directions may be changed at any time.

The term of "connect" or "connection" in the present specification may be not only a direct connection, but also a concept including an indirect connection through an adhesive layer or the like. In addition, the term "electrically connected" or "electrical connection" in the present specification is a concept including both a physical connection and a physical non-connection. Also, the expressions of "first," second," etc. in the present specification are used to distinguish one component from another, and do not limit the order and/or importance of the components. In some cases, without departing from the spirit of the present disclosure, a "first" component may be referred to as a "second" component, and similarly, a "second" component may be referred to as a "first" component.

The expression "example" used in this specification does not refer to the same embodiment to each other, but may be provided for emphasizing and explaining different unique features. However, the above-mentioned examples do not exclude that the above-mentioned examples are implemented in combination with the features of other examples. For example, although the description in a specific example is not described in another example, it can be understood as an explanation related to another example, unless otherwise described or contradicted by the other example.

The terms used in the present disclosure are used only to illustrate various examples and are not intended to limit the present inventive concept. Singular expressions include plural expressions unless the context clearly dictates otherwise.

As one of several effects of the present disclosure, a package substrate capable of being thinned, and, nevertheless, overcoming warpage may be provided.

As another effect of various effects of the present disclosure, a package substrate capable of improving a mounting defect of an electrically connecting metal such as solder balls may be provided.

While example embodiments have been illustrated and described above, it will be apparent to those skilled in the art that modifications and variations could be made without departing from the scope of the present disclosure as defined by the appended claims.

What is claimed is:

1. A package substrate comprising:
   a wiring substrate comprising an insulating layer, a first wiring layer disposed on a lower side of the insulating layer, and a second wiring layer disposed on an upper side of the insulating layer, wherein the first wiring layer comprises a first pad pattern, and the second wiring layer comprises a second pad pattern;
   a first passivation layer disposed on a lower surface of the insulating layer, and having a first opening portion passing through a region corresponding to at least a portion of the first pad pattern;
   a second passivation layer disposed on an upper surface of the insulating layer, and having a second opening portion passing through a region corresponding to at least a portion of the second pad pattern; and
   a reinforcing layer disposed on the second passivation layer, and having a through portion exposing the second opening portion,
   wherein an upper surface of the first wiring layer is located in a position higher than a position of the lower surface of the insulating layer,
   the reinforcing layer comprises a first reinforcing layer disposed on an upper surface of the second passivation layer and having a first through portion exposing the second opening portion, and a second reinforcing layer disposed on an upper surface of the first reinforcing layer and having a second through portion exposing the first through portion, and
   the first reinforcing layer is thicker than the second reinforcing layer, and wherein a width of the second through portion is wider than a width of the first through portion.

2. The package substrate according to claim 1, wherein the first and second reinforcing layers comprise different kinds of materials, and
   the second reinforcing layer comprises the same kind of material as the first passivation layer.

3. The package substrate according to claim 1, wherein the wiring substrate further comprises:
   a third wiring layer embedded in the insulating layer and disposed on a level between the first wiring layer and the second wiring layer,
   a first wiring via embedded in the insulating layer and connecting the first wiring layer and the third wiring layer to each other, and
   a second wiring via embedded in the insulating layer and connecting the second wiring layer and the third wiring layer to each other.

4. The package substrate according to claim 1, further comprising an electronic component disposed on the second passivation layer and connected to the second pad pattern in the through portion.

5. The package substrate according to claim 1, wherein the reinforcing layer further comprises a metal pattern disposed on an upper surface of the first reinforcing layer and embedded in the second reinforcing layer.

6. The package substrate according to claim 5, wherein the metal pattern is electrically insulated from the second wiring layer.

7. The package substrate according to claim 1, wherein the insulating layer has a recess portion in a position lower than a position of the insulating layer, wherein the first pad pattern is disposed in the recess portion, and at least a portion of a lower surface and a side surface of the first pad pattern is exposed from the insulating layer by the recess portion,
   wherein the first passivation layer is disposed in at least a portion of the recess portion, and covers at least a portion of the lower surface of the first pad pattern and at least a portion of the side surface of the first pad pattern.

8. The package substrate according to claim 7, further comprising a first surface treatment layer disposed in the first opening portion, and disposed on at least the other portion of the lower surface of the first pad pattern exposed from the first passivation layer by the first opening portion.

9. The package substrate according to claim 1, wherein the second wiring layer is disposed on and protrudes from the upper surface of the insulating layer, and
   at least a portion of the second wiring layer is embedded in the reinforcing layer.

10. The package substrate according to claim 9,
    wherein the second pad pattern is disposed in the second opening portion,
    the second opening portion exposes at least a portion of an upper surface and a side surface of the second pad pattern from the second passivation layer,
    the second opening portion exposes at least a portion of the upper surface of the insulating layer from the second passivation layer, and
    at least the portion of the upper surface and the side surface of the second pad pattern in the second opening portion is covered by a second surface treatment layer.

11. The package substrate according to claim 1, wherein the first pad pattern is embedded in a position lower than a position of the insulating layer to expose a lower surface of the first pad pattern from the lower surface of the insulating layer.

12. The package substrate according to claim 11, further comprising a metal layer disposed on the lower surface of the first pad pattern and the lower surface of the insulating layer,
    wherein a portion of a lower surface of the metal layer is covered by the first passivation layer,
    the other portion of the lower surface of the metal layer is exposed from the first passivation layer by the first opening portion, and
    a width of the metal layer is wider than a width of the first pad pattern.

13. The package substrate according to claim 12, further comprising a first surface treatment layer disposed on the other portion of the lower surface of the metal layer exposed from the first passivation layer by the first opening portion,
    wherein the width of the metal layer is wider than a width of the first surface treatment layer.

14. The package substrate according to claim 11, further comprising a metal layer disposed in the first opening portion, and disposed on at least a portion of the lower surface of the first pad pattern exposed from the first passivation layer by the first opening portion.

15. The package substrate according to claim 14, further comprising a first surface treatment layer disposed in the first opening portion, and disposed on a lower surface of the metal layer.

16. A package substrate comprising:
    a wiring substrate comprising an insulating layer, a first wiring layer embedded in the insulating layer and exposed from a lower surface of the insulating layer, and a second wiring layer protruding from an upper surface of the insulating layer, wherein the first wiring layer comprises a first pad pattern, and the second wiring layer comprises a second pad pattern;
    a first passivation layer disposed on the lower surface of the insulating layer, and having a first opening portion passing through a region corresponding to at least a portion of the first pad pattern;
    a second passivation layer disposed on the upper surface of the insulating layer and having a second opening portion; and
    a reinforcing layer disposed on the second passivation layer, and having a through portion exposing the second opening portion,
    wherein the lower surface of the insulating layer and a lower surface of the first wiring layer are coplanar with each other, and
    the second pad pattern is disposed in the second opening portion and is spaced apart from the second passivation layer.

17. The package substrate according to claim 16, further comprising an electronic component disposed in the through portion and connected to the second pad pattern.

18. The package substrate according to claim 16, further comprising a metal layer disposed on the lower surface of the first pad pattern and in the first opening portion,
    wherein a lower surface of the metal layer is spaced apart from a lower surface of the first passivation layer.

19. A package substrate comprising:
    a wiring substrate comprising an insulating layer, a first wiring layer disposed on a lower side of the insulating layer, and a second wiring layer disposed on an upper side of the insulating layer, wherein the first wiring layer comprises a first pad pattern, and the second wiring layer comprises a second pad pattern;
    a first passivation layer disposed on a lower surface of the insulating layer, and having a first opening portion passing through a region corresponding to at least a portion of the first pad pattern;
    a second passivation layer disposed on an upper surface of the insulating layer, and having a second opening portion passing through a region corresponding to at least a portion of the second pad pattern; and
    a reinforcing layer disposed on the second passivation layer, and having a through portion exposing the second opening portion,
    wherein an upper surface of the first wiring layer is located in a position higher than a position of the lower surface of the insulating layer,
    the reinforcing layer comprises a first reinforcing layer disposed on an upper surface of the second passivation layer and having a first through portion exposing the second opening portion, and a second reinforcing layer disposed on an upper surface of the first reinforcing layer and having a second through portion exposing the first through portion, and the reinforcing layer further comprises a metal pattern disposed on an upper surface of the first reinforcing layer and embedded in the second reinforcing layer.

20. The package substrate according to claim 19, wherein the metal pattern is electrically insulated from the second wiring layer.

\* \* \* \* \*